(12) United States Patent
Ma et al.

(10) Patent No.: US 9,154,104 B2
(45) Date of Patent: Oct. 6, 2015

(54) MINIATURIZED PASSIVE LOW PASS FILTER

(75) Inventors: Kai Xue Ma, Singapore (SG); Shouxian Mou, Singapore (SG); Kiat Seng Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 102 days.

(21) Appl. No.: 13/879,885

(22) PCT Filed: Nov. 2, 2010

(86) PCT No.: PCT/SG2010/000398
§ 371 (c)(1),
(2), (4) Date: Aug. 29, 2013

(87) PCT Pub. No.: WO2012/060775
PCT Pub. Date: May 10, 2012

(65) Prior Publication Data
US 2013/0328642 A1    Dec. 12, 2013

(51) Int. Cl.
*H03H 7/18* (2006.01)
*H03H 7/30* (2006.01)
*H03H 7/01* (2006.01)
*H03H 7/09* (2006.01)
*H03H 1/00* (2006.01)

(52) U.S. Cl.
CPC ........... *H03H 7/0138* (2013.01); *H03H 7/09* (2013.01); *H03H 7/1725* (2013.01); *H03H 7/1791* (2013.01); *H03H 2001/0064* (2013.01); *H03H 2001/0078* (2013.01)

(58) Field of Classification Search
USPC ................................................ 333/167–185
See application file for complete search history.

(56) References Cited

U.S. PATENT DOCUMENTS

| | | | | |
|---|---|---|---|---|
| 4,023,081 A | * | 5/1977 | Murray et al. | 318/109 |
| 6,115,234 A | * | 9/2000 | Ishii et al. | 361/303 |
| 6,791,434 B2 | * | 9/2004 | Tsujiguchi | 333/172 |
| 7,342,534 B1 | * | 3/2008 | Seddon et al. | 342/375 |
| 2001/0038323 A1 | * | 11/2001 | Christensen | 333/167 |
| 2002/0030561 A1 | * | 3/2002 | Masuda et al. | 333/177 |
| 2002/0065040 A1 | * | 5/2002 | Straub | 455/25 |
| 2006/0087387 A1 | * | 4/2006 | Kubota et al. | 333/204 |
| 2007/0001786 A1 | * | 1/2007 | Kundu | 333/204 |
| 2010/0007437 A1 | * | 1/2010 | Taniguchi | 333/175 |
| 2010/0171568 A1 | * | 7/2010 | Taniguchi | 333/176 |
| 2010/0214037 A1 | * | 8/2010 | Plager et al. | 333/185 |
| 2011/0074526 A1 | * | 3/2011 | Taniguchi | 333/185 |

* cited by examiner

*Primary Examiner* — Brandon S Cole
(74) *Attorney, Agent, or Firm* — K. David Crockett, Esq.; Niky Economy Syrengelas, Esq.; Crockett & Crockett, PC

(57) ABSTRACT

A low pass filter circuit (100) structure is provided. The low pass filter circuit structure includes first and second dominant inductor (114, 116)s, a first capacitor (120) and first and second shunt capacitors (122, 124). The first dominant inductor has a first end and a second end and the second dominant inductor has a first end and a second end. The second end of the first dominant inductor is electrically connected to the second end of the second dominant inductor. The first capacitor is electrically coupled between the first end of the first dominant inductor and the first end of the second dominant inductor. The first shunt capacitor is electrically coupled between the first end of the first dominant inductor and a ground potential, and the second shunt capacitor is electrically coupled between the first end of the second dominant inductor and the group potential. The first dominant inductor and the second dominant inductor are further coupled by one or both of magnetic coupling and parasitic mutual capacitive coupling.

20 Claims, 11 Drawing Sheets

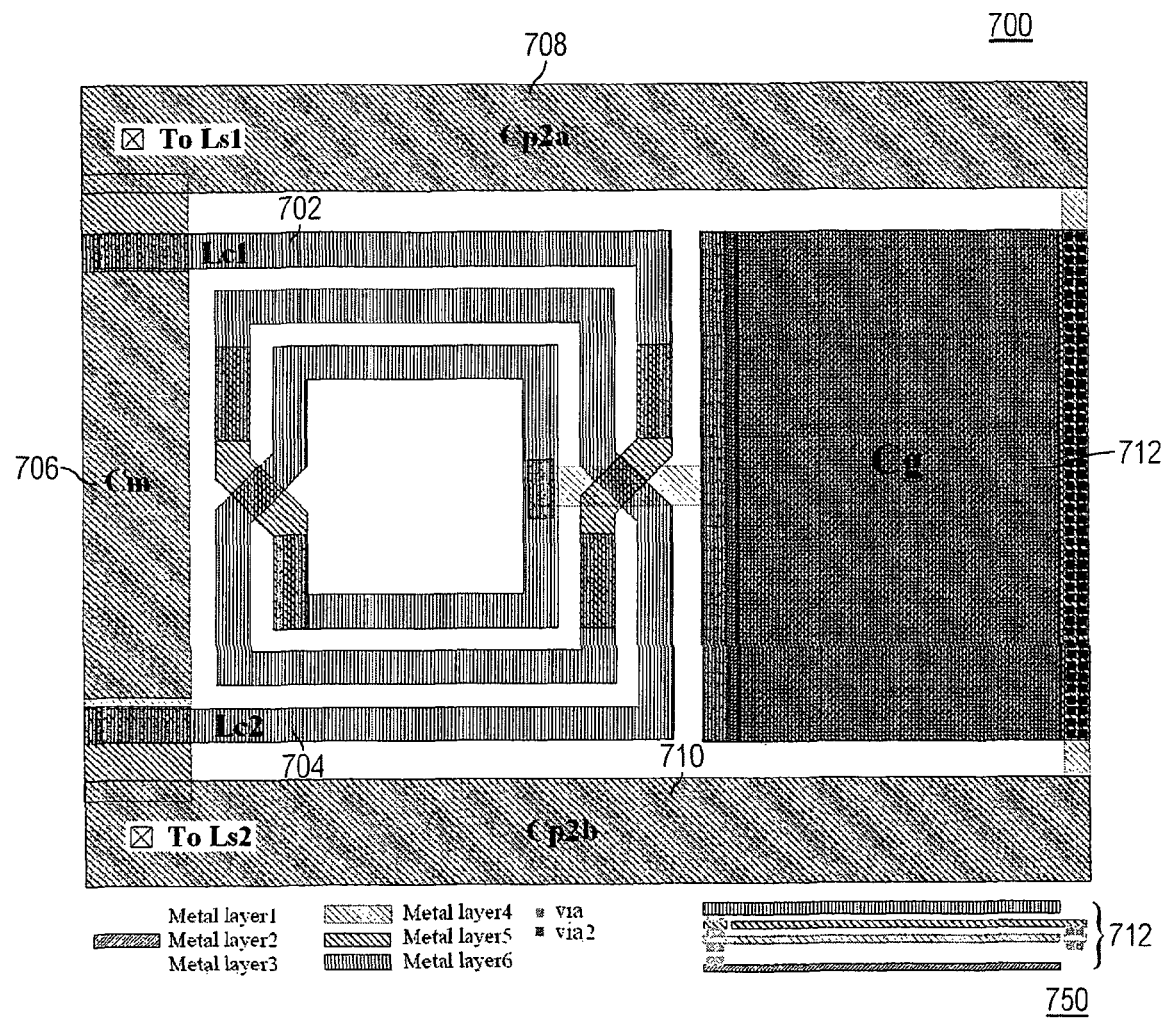
*FIG. 7A*     *FIG. 7B*

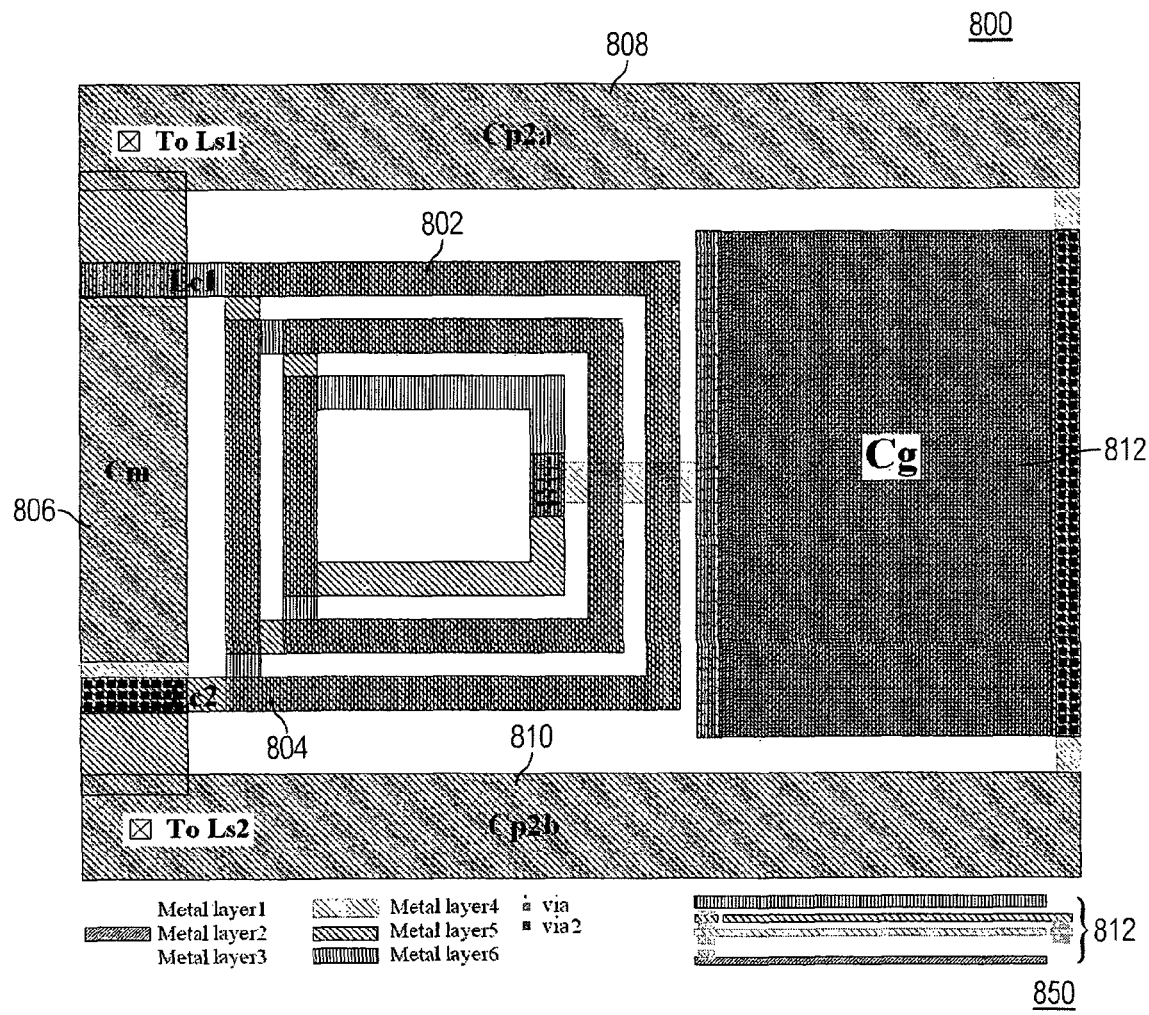
*FIG. 8A*          *FIG. 8B*

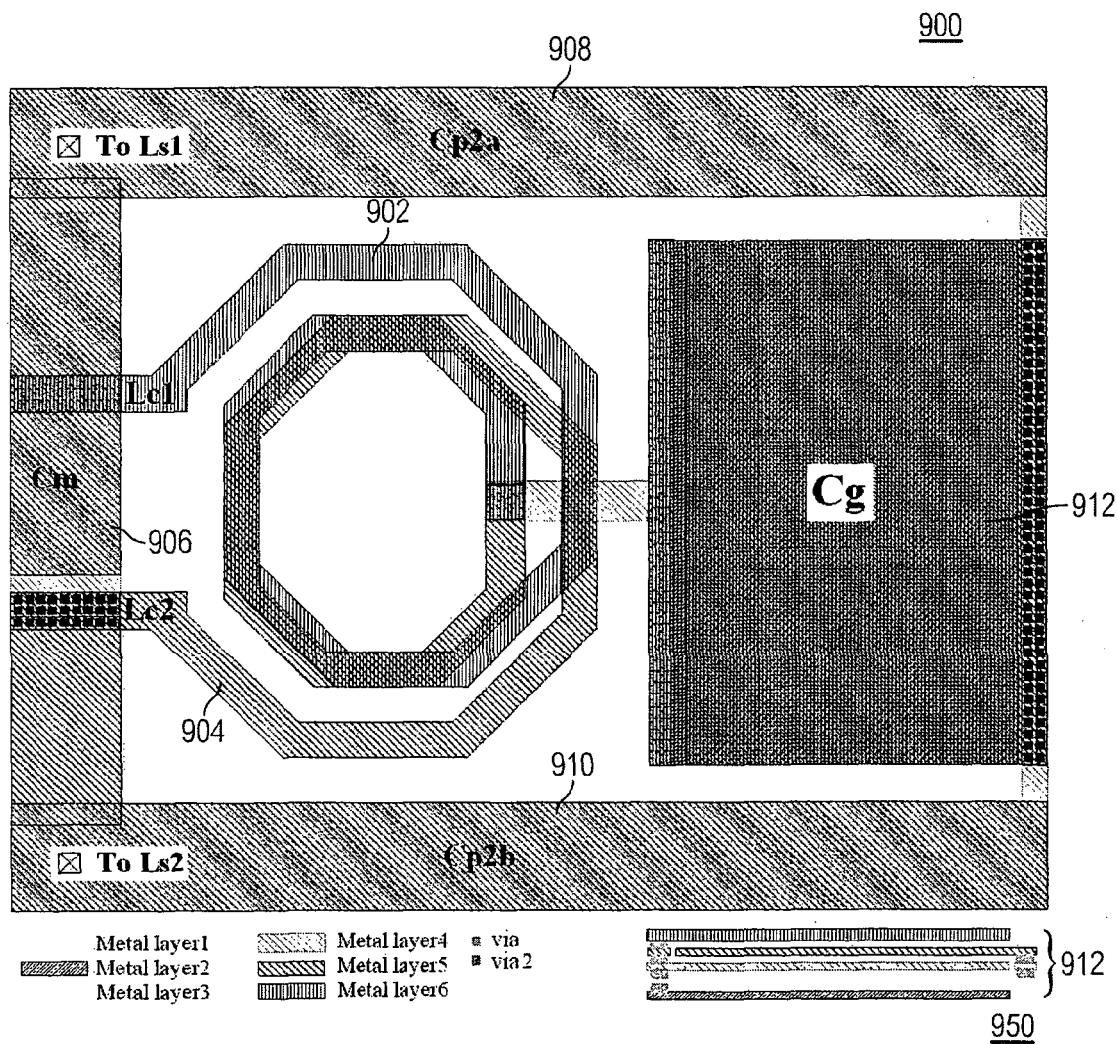
*FIG. 9A*  *FIG. 9B*

MINIATURIZED PASSIVE LOW PASS FILTER

FIELD OF THE INVENTION

The present invention generally relates to low pass filters, and more particularly relates to a miniaturized passive low pass filter suitable for implementation in a radio frequency (RF) integrated circuit.

BACKGROUND OF THE DISCLOSURE

Low pass filters are utilized in radio frequency (RF) front end circuits to remove undesired harmonics or spurious signals resulting from the mixing of signals in the RF front end circuit. It is important to design low pass filters with a wide stopband and a high stopband rejection to improve the linearity of the RF front end circuit and to reduce the bit-error-rate (BER) in high date rate communication systems. It is also important for the low pass filter to have a compact size and an integration ability to reduce cost of the RF integrated circuit.

While stepped impedance low pass filters and open stub low pass filters are commonly used for low pass filter implementation, the stepped impedance low pass filters and open stub low pass filters have a disadvantage in that both implementations provide a gradual cut-off response. By increasing the number of sections of the step impedance low pass filters or the open stub low pass filters, the rejection characteristics of the low pass filters can be improved. However, increasing the number of sections will increase passband insertion loss as well as the physical dimensions of the low pass filters. Some low pass filters employ a semi-lumped element composed of a lumped capacitor and a section of transmission line to cope with this problem. However, the use of multiple lumped elements will increase the component cost of the low pass filters as well as increasing the assembly cost of the RF integrated circuit, especially for low pass filters operating in a high RF frequency range. Multi-section low pass filters using microstrip line and microstrip elements such as interdigital capacitors, coupled lines and stepped-impedance hairpin resonators are other effective approaches. A stepped-impedance hairpin resonator allows design of low pass filters of relative smaller size and with an additional zero point in the stopband (e.g., achieved through an additional electric coupling path). In addition, defected ground structure (DGS) microstrip line structures have been utilized in low pass filters to implement wide stopband. However, the DGS microstrip line structure introduces disadvantages. For example, DGS microstrip line structure increase radiation due to a partially open ground plane, requiring a metallic enclosure to shield the DGS structure, and thereby increasing the cost of the low pass filters.

Generally, most of the prior art low pass filter designs are quite bulky, which is not economic to use with other circuits, especially they are not possible to be integrated with RF integrated circuits. Active low pass filter designs have been proposed to overcome the cost and integration issues. However, active low pass filters usually contribute more noise than their passive counterparts and have very limited stopband performance. Another important drawback is that active low pass filters consume power.

Thus, what is needed is a low pass filter design which successfully and simultaneously addresses the problems of compactness, in-band matching, insertion loss, stopband rejection and stopband bandwidth. Furthermore, other desirable features and characteristics will become apparent from the subsequent detailed description and the appended claims, taken in conjunction with the accompanying drawings and this background of the disclosure.

SUMMARY OF THE INVENTION

According to the Detailed Description, a low pass filter is provided. The low pass filter includes first and second dominant inductors, a first capacitor and first and second shunt capacitors. The first dominant inductor has a first end and a second end and the second dominant inductor has a first end and a second end. The second end of the first dominant inductor is electrically connected to the second end of the second dominant inductor. The first capacitor is electrically coupled between the first end of the first dominant inductor and the first end of the second dominant inductor. The first shunt capacitor is electrically coupled between the first end of the first dominant inductor and a ground potential, and the second shunt capacitor is electrically coupled between the first end of the second dominant inductor and the ground potential. The first dominant inductor and the second dominant inductor are further coupled by one or both of magnetic coupling and parasitic mutual capacitive coupling.

In addition, an integrated circuit low pass filter is provided. The integrated circuit low pass filter includes first and second dominant inductors, first and second capacitors and first and second shunt capacitors. The first dominant inductor has a first end and a second end and the second dominant inductor has a first end and a second end. The second end of the first dominant inductor is electrically connected to the second end of the second dominant inductor. The first capacitor is electrically coupled between the first end of the first dominant inductor and the first end of the second dominant inductor. The first shunt capacitor is electrically coupled between the first end of the first dominant inductor and a ground potential, and the second shunt capacitor is electrically coupled between the first end of the second dominant inductor and the ground potential. The second capacitor is coupled between a node connecting the second end of the first dominant inductor to the second end of the second dominant inductor and the ground potential. The first dominant inductor and the second dominant inductor are further coupled by one or both of magnetic coupling and parasitic mutual capacitive coupling. In addition, the integrated circuit low pass filter has a response of an elliptical filter with one or more zero points generated in a stopband of the integrated circuit low pass filter.

Further, an integrated circuit low pass filter comprising multiple low pass filter circuit structures is provided. Each of the multiple low pass filter circuit structures has an input port and an output port. The multiple low pass filter circuit structures are cascaded up to N stages, where N is an integer equal to or larger than one, by coupling an output port of one structure to an input port of another structure through a device selected from the group consisting of transmission lines and inductors. Further, each multiple low pass filter circuit structure includes first and second dominant inductors, first and second capacitors, first and second shunt capacitors, an input inductor, and an output inductor. The first dominant inductor has a first end and a second end and the second dominant inductor has a first end and a second end. The second end of the first dominant inductor is electrically connected to the second end of the second dominant inductor. The first capacitor is electrically coupled between the first end of the first dominant inductor and the first end of the second dominant inductor. The first shunt capacitor is electrically coupled between the first end of the first dominant inductor and a ground potential, and the second shunt capacitor is electrically coupled between the first end of the second dominant inductor and the ground potential. The input inductor is coupled between the input port and the first end of the first dominant inductor, and the output inductor is coupled between the output port and the first end of the second dominant inductor. The second capacitor is coupled between a node connecting the second end of the first dominant inductor to the second end of the second dominant inductor and the ground potential. Further, the low pass filter structure has a response of an elliptical filter with one or more zero points generated in a stopband of the low pass filter structure.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

FIGS. 7A and 7B are a top planar view and a partial side planar view, respectively, of an integrated circuit low pass filter in accordance with the present embodiment wherein the first and second dominant inductors are implemented with differential inductors;

FIGS. 8A and 8B are a top planar view and a partial side planar view, respectively, of an integrated circuit low pass filter in accordance with the present embodiment wherein the first dominant inductor overlaps the second dominant inductor;

FIGS. 9A and 9B are a top planar view and a partial side planar view, respectively, of an integrated circuit low pass filter in accordance with the present embodiment wherein the first dominant inductor and the second dominant inductor are octagonally shaped and partially overlap one another;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
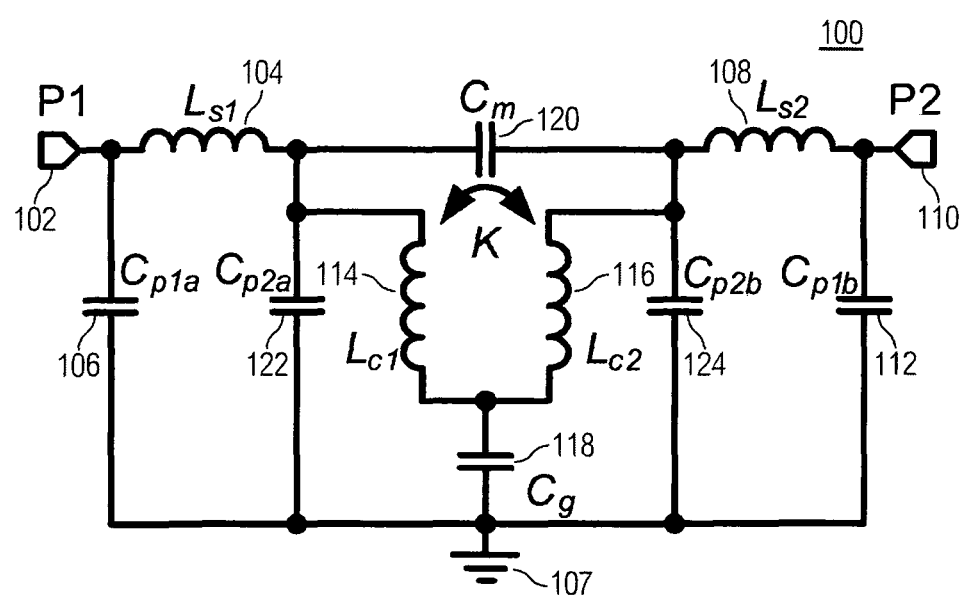
FIG. 1 is a circuit diagram of a low pass filter in accordance with a present embodiment.

Referring to FIG. 1, a physical based equivalent circuit diagram 100 of a low pass filter in accordance with a present embodiment is depicted. An input port P1 102 is connected to an input port inductor $L_{s1}$ 104 and a capacitor $C_{p1a}$ 106 is connected between the input port 102 and a ground potential 107. An output port inductor $L_{s2}$ 108 is connected to an output port P2 110, while a capacitor $C_{p1b}$ 112 is connected between the output port P2 110 and the ground potential 107. Inductors $L_{c1}$ 114 and $L_{c2}$ 116 are the magnetic-coupling dominant inductors, with one end of each forming a common terminal or node which is connected through a capacitor $C_g$ 118 to the ground potential 107. The other ends (terminals) of the two dominant inductors 114, 116 are connected to the input inductor $L_{s1}$ 104 and the output inductor $L_{s2}$ 108, respectively.

An electric-coupling capacitor $C_m$ 120 is connected between one end each of the two dominant inductors 114, 116 (which ends are connected to an end of the input inductor and an end of the output inductor). Shunt capacitors $C_{p2a}$ 122 and $C_{p2b}$ 124 are connected between respective ends of the two dominant inductors 114, 116 and the ground potential 107.

The ideal equivalent circuit model can be analyzed through using the even-mode and odd-mode method. As a simplified example, the models are treated symmetrical, i.e. $L_{s1}=L_{s2}=L_s$, $C_{p1a}=C_{p1b}=C_{p1}$, $C_{p2a}=C_{p2b}=C_{p2}$ and $L_{c1}=L_{c2}=L$. The disclosed low pass prototype in accordance with the present embodiment can also apply to the condition of non-symmetrical models, however some changes may have to be made to some or all of the following equations. The even-mode and odd-mode admittance of the equivalent circuit model can be calculated in accordance with Equations (1) and (2):

$$Y_{ino} = j\omega C_{p1} + \cfrac{1}{j\omega L_s + \cfrac{1}{j\omega(C_{p1}+2C_m) + \cfrac{1}{j\omega(L-L_m)}}} \quad (1)$$

$$Y_{ine} = j\omega C_{p1} + \cfrac{1}{j\omega L_s + \cfrac{1}{j\omega C_{p1} + \cfrac{1}{j\omega(L+L_m) + \cfrac{2}{j\omega C_g}}}} \quad (2)$$

where $L_m = k \times L$, k denoting the magnetic coupling factor between the two dominant inductors $L_{c1}$ 114 and $L_{c2}$ 116, wherein $L_m$ represents a coupling inductor value. The S-parameter of the proposed equivalent circuits can be calculated through the odd- and even-mode admittance in accordance with Equations (3) and (4):

$$S21 = \frac{Y_{ino} - Y_{ine}}{(1 + Y_{ine}) \times (1 + Y_{ino})} \quad (3)$$

$$S11 = \frac{1 - Y_{ine} \times Y_{ino}}{(1 + Y_{ine}) \times (1 + Y_{ino})} \quad (4)$$

Accordingly, the proposed low pass filter in accordance with the present embodiment can generate transmission zero points when the even-mode admittance is equal to the odd admittance. The generated zero points can help to extend the stopband bandwidth and enhance the stopband rejection.

Figure 2:
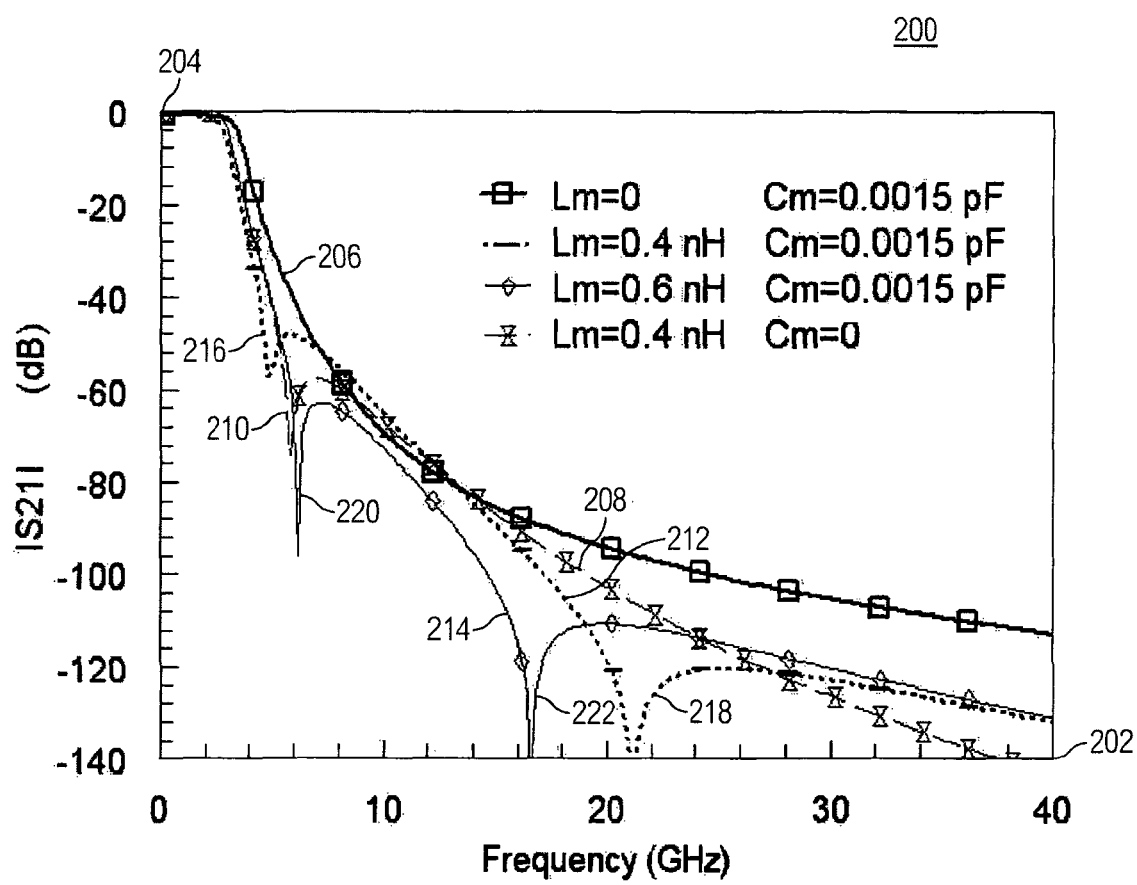
FIG. 2 is a graph of transmission characteristics of the circuit of FIG. 1 in accordance with the present embodiment where a value of the first and second shunt capacitors is 1.5 picoFarads.
Figure 3:
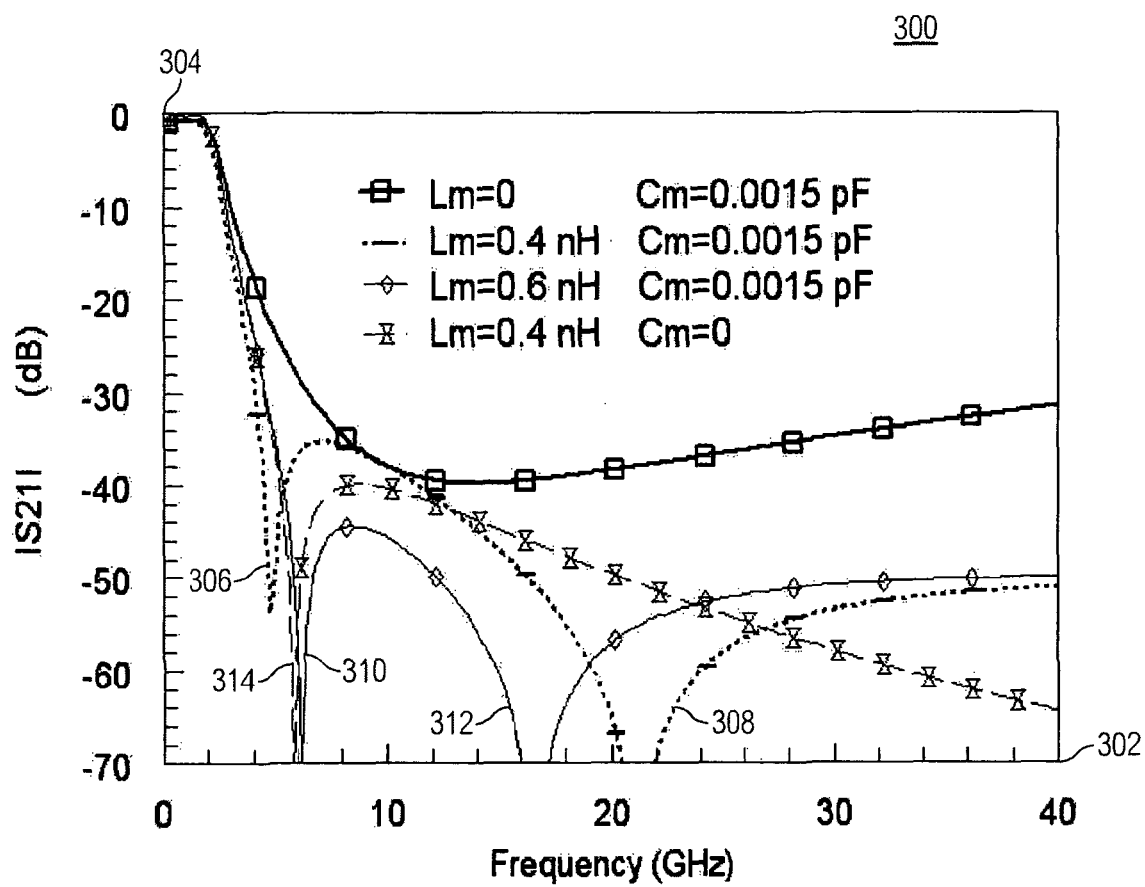
FIG. 3 is a graph of transmission characteristics of the circuit of FIG. 1 in accordance with the present embodiment where a value of the first and second shunt capacitors is 0.0001 picoFarads.

The transmission characteristics of the ideal equivalent low pass filter circuit model in accordance with the present embodiment with different component parameters is illustrated in the graphs of FIG. 2 and FIG. 3. Referring to FIG. 2, a graph 200 is depicted showing S21 204 (plotted on the y-axis) versus frequency 202 (plotted on the x-axis) of the low pass filter circuit 100 in accordance with the present embodiment. Transmission characteristics reveal multiple notches in some cases when the first dominant inductor $L_{c1}$ 114 and the second dominant inductor $L_{c2}$ 116 are magnetically coupled and capacitively coupled (in terms of a coupling inductor with value $L_m$ and the coupling capacitor $C_m$ 120). When $L_m$=0 and $C_m$=0.0015 picoFarads on trace 206, there is no zero point (notch) in the stopband and the roll off from passband to stopband is gradual. When $L_m$=0.4 nanoHenrys while $C_m$=0 on trace 208, the roll off from passband to stopband is steep with only one notch 210. When $L_m$=0.4 nanoHenrys and $C_m$=0.0015 picoFarads on trace 212, or $L_m$=0.6 nanoHenrys and $C_m$=0.0015 picoFarads on trace 214, the roll off from passband to stopband is even steeper with two notches (notches 216, 218 and notches 220, 222), which increases the bandwidth of the stopband and improves the stopband rejection in the range of 5 GHz to 22 GHz.

Referring to FIG. 3, a similar graph 300 is depicted showing S21 304 (plotted on the y-axis) versus frequency 302 (plotted on the x-axis) of the low pass filter circuit 100 in accordance with the present embodiment. FIG. 3 shows the transmission characteristics when the value of $C_{p1}$ is decreased to 0.0001 pF. The corresponding stopband rejection degrades compared with $C_{p2}$=1.5 pF in FIG. 2. Transmission characteristics reveal multiple notches in the case when the first dominant inductor $L_{c1}$ 114 and the second dominant inductor $L_{c2}$ 116 are magnetically coupled. For example, when the inductor of the inductor-capacitor pair ($L_m$, $C_m$) has a value of 0.4 nanoHenrys and the capacitor has a value of 0.0015 picoFarads, notches 306, 308 can be seen. Likewise, when the inductor of the inductor-capacitor pair ($L_m$, $C_m$) has a value of 0.6 nanoHenrys and the capacitor has a value of 0.0015 picoFarads, notches 310, 312 can be seen. Notch 314 corresponds to the capacitor having a value of zero and the inductor having a value of 0.4 nanoHenrys.

The results of FIG. 2 and FIG. 3 indicate that when $L_m$=0, no matter with large $C_{p1}$ or small $C_{p2}$, the stopband performance is not very good. When $L_m \neq 0$, while $C_m$=0, the stopband performance improves with one notch, but the band rejection from 5 GHz to 22 GHz is still not so good. When both $L_m \neq 0$ and $C_m \neq 0$, the stopband roll off is steep, and there are two zero points (notches) to further enhance the stopband bandwidth and rejection. The analysis proves the low pass filter circuit 100 in accordance with the present embodiment can help to realize an ultra-wide stopband with superior stopband rejection, which can benefit the linearity and bit-error-rate (BER) of the communication systems. Most important, the low pass filter circuit 100 in accordance with the present embodiment provides low insertion loss of passband, zero power consumption and compact size.

Figure 4:
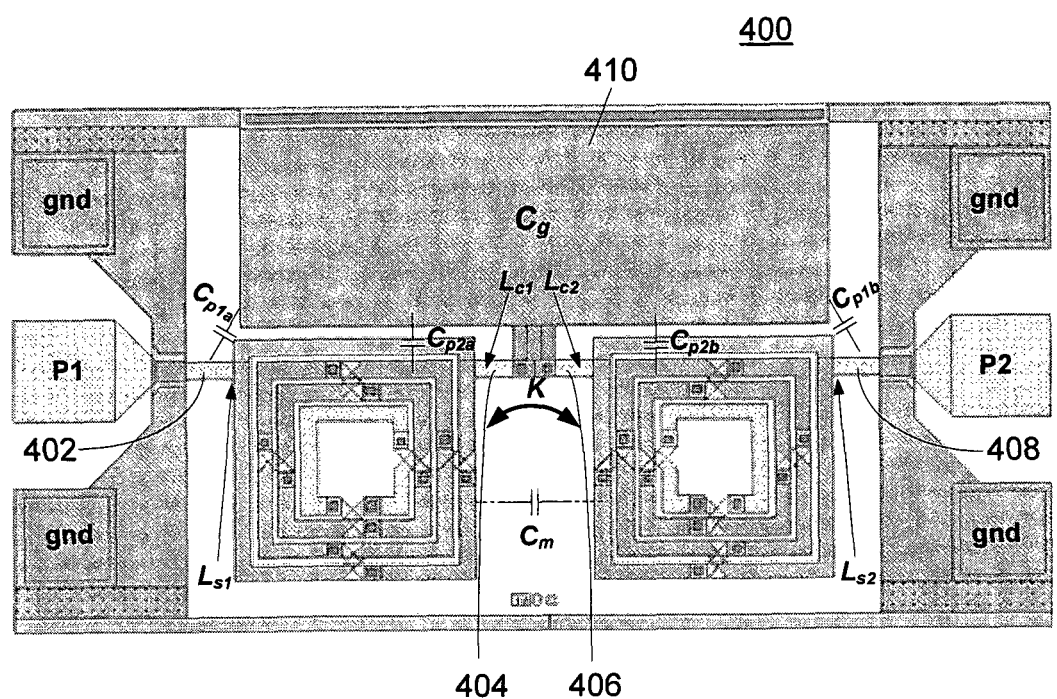
FIG. 4 is a top planar view of a 900 MHz integrated circuit low pass filter in accordance with the present embodiment.

Referring to FIG. 4, a top planar view 400 of a 900 MHz integrated circuit low pass filter in accordance with the present embodiment is shown. The integrated circuit low pass filter of FIG. 4 depicts an implementation of the low pass filter in accordance with the present embodiment based on a standard SiGe CMOS process. The chip area is very small (less than 0.1 mm$^2$), which greatly reduces the cost of the low pass filter design and also makes it possible for high-performance low pass filters to be fully integrated for a complete system on chip (SoC) solution. In FIG. 4, the four inductors $L_{s1}$ 402, $L_{c1}$ 404, $L_{c2}$ 406 and $L_{s2}$ 408 use multi-layer structure to reduce chip area. The coupling effect of $L_{c1}$ 404 and $L_{c2}$ 406 are dependent on their distance. The distance can be adjusted to achieve different zero points for different applications. Practically, by proper designing of the low pass filter circuit in accordance with the present embodiment, the parasitic capacitance of the multi-layer capacitor $C_g$ 410 can help to generate another notch, which can further widen the stopband.

Figure 5:
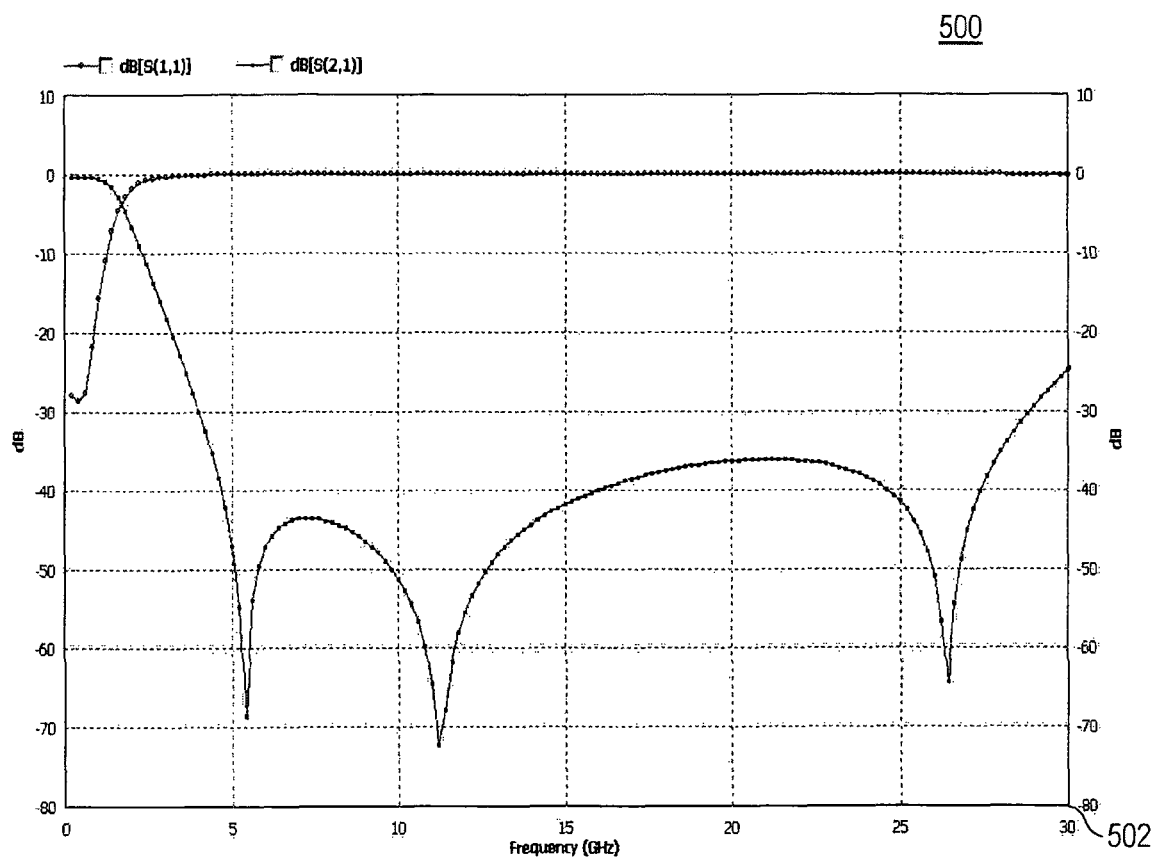
FIG. 5 is a graph of transmission characteristics of the 900 MHz integrated circuit low pass filter of FIG. 4 in accordance with the present embodiment.
Figure 6:
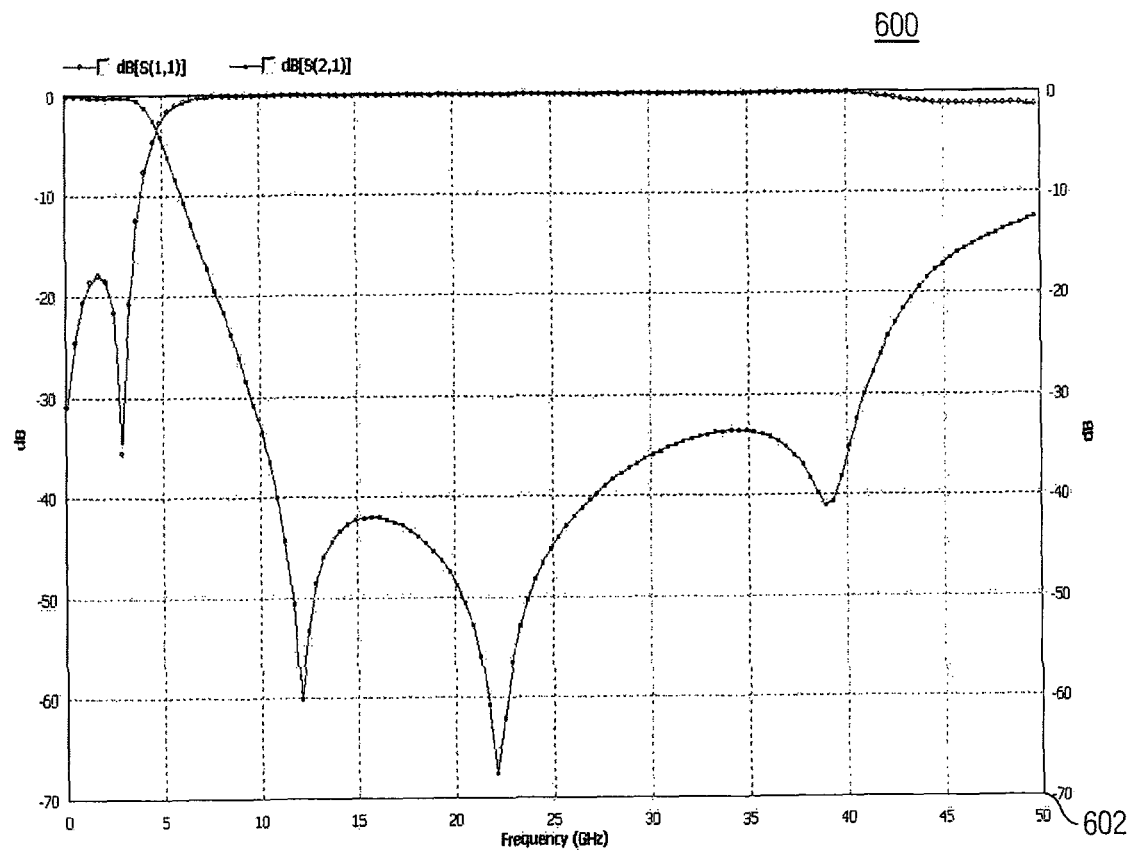
FIG. 6 is a graph of transmission characteristics of a 3 GHz integrated circuit low pass filter in accordance with the present embodiment.

The performance of a 900 MHz low pass filter and a 3 GHz low pass filter implemented in accordance with the present embodiment, are demonstrated in FIG. 5 and FIG. 6, respectively. Referring to graph 500 in FIG. 5, frequency is plotted along the x-axis 502. For the 900 MHz low pass filter, the passband input matching is up to −28 dB, while the insertion loss of the passband is less than 0.5 dB. The high rejection stopband is up to 30 GHz, which helps to filter out the high-order harmonics and spurious signals. The chip area is less than 0.1 mm$^2$.

Referring to graph 600 in FIG. 6, frequency is plotted along the x-axis 602. The passband input matching is less than −18 dB, the insertion loss is less than 0.5 dB, and the stopband is up to 50 GHz. The chip area is around 0.06 mm$^2$.

The designs verified the dedicated new LPF invention. For example, FIGS. 7A and 7B are a top planar view 700 and a partial side planar view 750, respectively, of an integrated circuit low pass filter structure in accordance with the present embodiment as implemented by a SiGe BiCMOS process. The coupled inductor $L_{c1}$ 702 and $L_{c2}$ 704 are implemented with differential inductors. Capacitors $C_m$ 706, $C_{p2a}$ 708 and $C_{p2b}$ 710 are realized by metal layer 5 and metal layer 4. Capacitor $C_g$ 712 is a 5-layer sandwich capacitor to enhance capacitance density and reduce chip area and the five layers are depicted in the partial side view 750 (FIG. 7B).

FIGS. 8A and 8B are a top planar view 800 and a partial side planar view 850, respectively, of an integrated circuit low pass filter structure in accordance with the present embodiment. FIG. 8A illustrates an example of the low pass filter structure as implemented in some SiGe BiCMOS process. Inductor $L_{c1}$ 802 using metal layer 6 overlaps with inductor $L_{c2}$ 804 using metal layer 5. Capacitors $C_m$ 806, $C_{p2a}$ 808 and $C_{p2b}$ 810 are realized by metal layer 5 and metal layer 4. Capacitor $C_g$ 812 is a 5-layer sandwich high-density capacitor which is further depicted in view 850 (FIG. 8B).

FIGS. 9A and 9B are a top planar view 900 and a partial side planar view 950, respectively, of an integrated circuit low pass filter structure in accordance with the present embodiment. FIG. 9A illustrates an example of the low pass filter structure as implemented in some SiGe BiCMOS process. Inductors $L_{c1}$ 902 and $L_{c2}$ 904 are octagonally shaped and they are partially-overlapped. $C_m$ 906, $C_{p2a}$ 908 and $C_{p2b}$ 910 are implemented in metal layer 5 and metal layer 4. $C_g$ 912 is a 5-layer sandwich high density capacitor which is further depicted in view 950 (FIG. 9B).

Figures 10A, 10B, 10C:
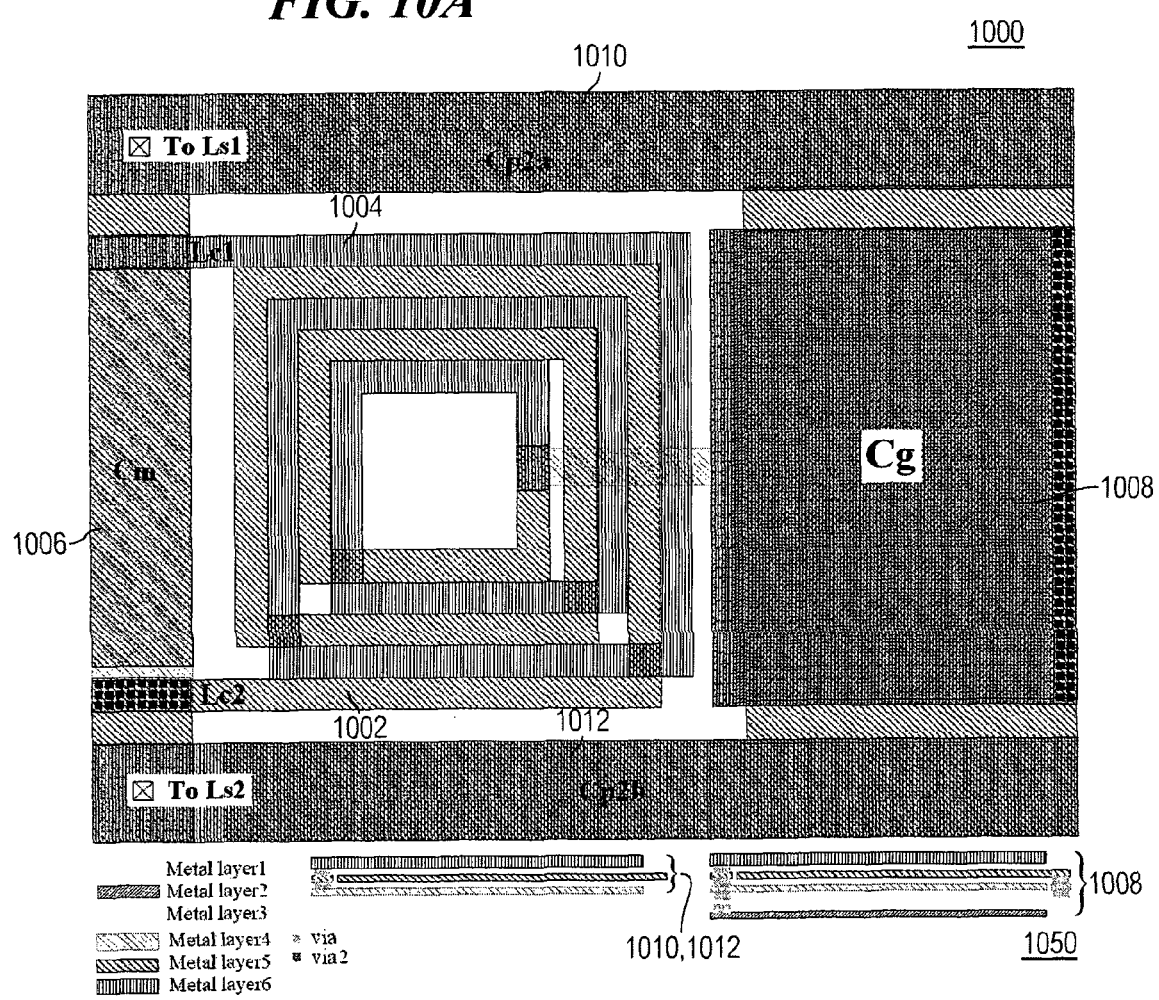
FIGS. 10A, 10B and 10C are a top planar view and two partial side planar views, respectively, of an integrated circuit low pass filter in accordance with the present embodiment wherein coils of the first dominant inductor are positioned in gaps of coils of the second dominant inductor.

FIGS. 10A, 10B and 10C are a top planar view 1000, a first partial side planar view 1050, and a second partial side planar view 1060, respectively, of an integrated circuit low pass filter structure in accordance with the present embodiment. FIG. 10A illustrates an example of the low pass filter structure as implemented in some SiGe BiCMOS process. The coils of the rectangular inductor $L_{c2}$ 1002 using metal layer 5 are positioned in gaps between the coils of $L_{c1}$ 1004 with metal layer 6. Capacitor $C_m$ 1006 is realized by metal layer 5 and metal layer 4. Capacitor $C_g$ 1008 is a 5-layer sandwich high-density capacitor which is further depicted in view 1050 (FIG. 10B). And capacitors $C_{p2a}$ 1010 and $C_{p2b}$ 1012 adopt 3-layer sandwich structure to increase capacitance, the 3-layer sandwich structure is further depicted in partial side view 1060 (FIG. 10C).

Figures 11A, 11B:
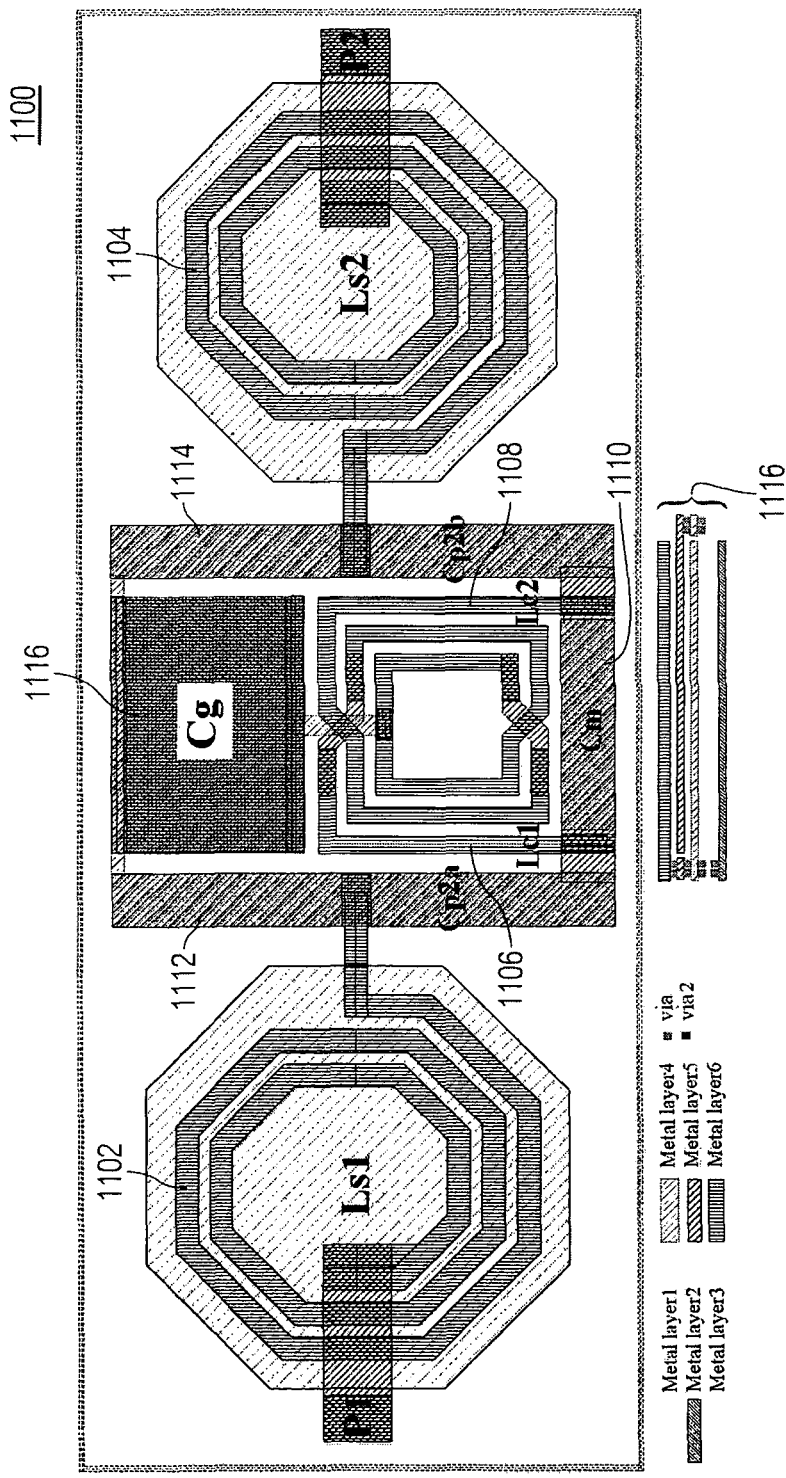
FIGS. 11A and 11B are a top planar view and a partial side planar view, respectively, of an integrated circuit low pass filter in accordance with the present embodiment wherein the first dominant inductor and the second dominant inductor are implemented with differential inductors and the input inductor and output inductor are implemented with discrete octagonally-shaped structures.

FIGS. 11A and 11B are a top planar view 1100 and a partial side planar view 1150, respectively, of an integrated circuit low pass filter structure in accordance with the present embodiment. FIG. 11A depicts a low pass filter fundamental structure implementation in view 1100 in accordance with the present embodiment with input inductor $L_{s1}$ 1102 and output inductor $L_{s2}$ 1104. The coupled inductors $L_{c1}$ 1106 and $L_{c2}$ 1108 are implemented with a differential inductor. The inductors $L_{s1}$ 102 and $L_{s2}$ 1104 in FIG. 11A are implemented with the same metal layer as $L_{c1}$ 1106 and $L_{c2}$ 1108. There is also a semiconductor well under the octagonal $L_{s1}$ 1102 and $L_{s2}$ 1104 to enhance the quality factor of the low pass filter. Capacitors $C_m$ 1110, $C_{p2a}$ 1112 and $C_{p2b}$ 1114 are realized by metal layer 5 and metal layer 4. Capacitor $C_g$ 1116 is a 5-layer sandwich capacitor with high capacitance density which is further depicted in view 1150 (FIG. 11B).

The prior art does not reveal any low pass filter circuit configurations which have successfully addressed simultaneously the problems of compactness, in-band matching, insertion loss, stopband rejection and stopband bandwidth (which is important to further suppress the spurious signals and undesired harmonics). The present embodiment as described hereinabove sets out several techniques based on magnetic-coupled and electric-coupled inductors incorporated with capacitors, to realize low insertion loss, ultra-wide stopband as well as superior stopband attenuation and high linearity, while consuming zero power and using very little semiconductor chip area.

The present embodiment allows a low pass filter to be fabricated on a semiconductor substrate. Thus, the low pass filter is fully integratable, thereby making a complete system on chip (SoC) solution possible. Furthermore, a low pass filter in accordance with the present embodiment allows the use of standard process for fabrication without additional materials or additional special process procedures. As such, the low pass filter in accordance with the present embodiment provides a highly scalable low pass filter circuit. In addition, the low pass filter circuit has been miniaturized. It is now sufficiently small enough to be easily integrated on a semiconductor chip, while saving expensive semiconductor area. In addition to common semiconductor materials, the low pass filter circuit in accordance with the present embodiment can be implemented with ceramic and other processes.

With magnetic-coupled and electric-coupled paths through inductors or capacitors or both, a low pass filter in accordance with the present embodiment creates more zero points (notches) in the stopband, therefore extending the stopband bandwidth and enhance the stopband rejection.

Thus it can be seen that a low pass filter design has been disclosed which successfully, simultaneously and advantageously addresses the problems of compactness, in-band matching, insertion loss, stopband rejection and stopband bandwidth. While at least one exemplary embodiment has been presented in the foregoing detailed description of the invention, it should be appreciated that a vast number of variations exist, including a vast number of integrated circuit enablements of the low pass filter structure in accordance with the present embodiment.

Various embodiments may provide a low pass filter including a first dominant inductor having a first end and a second end; a second dominant inductor having a first end and a second end, wherein the second end of the first dominant inductor is electrically connected to the second end of the second dominant inductor; a first capacitor electrically coupled between the first end of the first dominant inductor and the first end of the second dominant inductor; a first shunt capacitor electrically coupled between the first end of the first dominant inductor and a ground potential; and a second shunt capacitor electrically coupled between the first end of the second dominant inductor and the ground potential, wherein the first dominant inductor and the second dominant inductor are further coupled by one or both of magnetic coupling and parasitic mutual capacitive coupling.

In various embodiments, the low pass filter may further include a second capacitor coupled between a node connecting the second end of the first dominant inductor to the second end of the second dominant inductor and the ground potential for the low pass filter to have a response of an elliptical filter with one or more zero points generated in a stopband of the low pass filter. A value of either or both of the first shunt capacitor and the second shunt capacitor may be determined in response to performance of the low pass filter in the stopband.

In various embodiments, the low pass filter may further include an input inductor coupled between an input port and the first end of the first dominant inductor; and an output inductor coupled between an output port and the first end of the second dominant inductor, wherein either the input inductor and the output inductor or the input port and the output port may be electrically coupled by parasitic mutual capacitance. In various embodiments, a value of the first dominant inductor may be equal to a value of the second dominant inductor. In other embodiments, a value of the first dominant inductor may not be equal to a value of the second dominant inductor.

In various embodiments, the low pass filter may further include a load coupled between the input port and the output port. The input port and the output port coupled to the load selected from the group consisting of a fifty ohm load and other kinds of loads or circuits.

In various embodiments, any of the first dominant inductor, the second dominant inductor, the input inductor, the output inductor, the first capacitor, the second capacitor, the first shunt capacitor or the second shunt capacitor may have a form selected from the group consisting of an inductor in series with a resistor, a capacitor in series with a resistor, and any combination of an inductor in series with a resistor and a capacitor in series with a resistor.

Various embodiments may provide an integrated circuit low pass filter including a first dominant inductor having a first end and a second end; a second dominant inductor having a first end and a second end, wherein the second end of the first dominant inductor is electrically connected to the second end of the second dominant inductor; a first capacitor electrically coupled between the first end of the first dominant inductor and the first end of the second dominant inductor; a first shunt capacitor electrically coupled between the first end of the first dominant inductor and a ground potential; a second shunt capacitor electrically coupled between the first end of the second dominant inductor and the ground potential; and a second capacitor coupled between a node connecting the second end of the first dominant inductor to the second end of the second dominant inductor and the ground potential, wherein the first dominant inductor and the second dominant inductor are further coupled by one or both of magnetic coupling and parasitic mutual capacitive coupling, and wherein the integrated circuit low pass filter has a response of an elliptical filter with one or more zero points generated in a stopband of the integrated circuit low pass filter.

In various embodiments, the first dominant inductor and the second dominant inductor may have substantially similar dimensions. In other embodiments, the first dominant inductor and the second dominant inductor may not have similar dimensions.

In various embodiments, the first dominant inductor and the second dominant inductor may include a structure selected from the groups consisting of high impedance transmission lines, on-chip spiral inductors, and differential inductors.

In various embodiments, the first dominant inductor and the second dominant inductor may be implemented on one metal layer. In other embodiments, the first dominant inductor and the second dominant inductor may be implemented on two metal layers or multiple metal layers and either overlap or partially-overlap.

In various embodiments, the integrated circuit low pass filter may further include an input inductor coupled between an input port and the first end of the first dominant inductor, wherein the input inductor and the first dominant inductor may be implemented on either the same metal layer, two metal layers or multiple metal layers.

In various embodiments, the integrated circuit low pass filter may further include an output inductor coupled between an output port and the first end of the second dominant inductor, wherein the output inductor and the second dominant inductor may be implemented on either the same metal layer, two metal layers or multiple metal layers.

In various embodiments, the structure of either or both of the first dominant inductor and the second dominant inductor may include on-chip spiral inductors comprising spiral metal layers wherein a shape of the spiral metal layers may be selected from the group consisting of rectangular, octagonal, circular, hexagonal and any other shape.

In various embodiments, the integrated circuit low pass filter may include structure implemented in semiconductor technologies selected from the group consisting of CMOS, GaAs, SiGe, InP and ceramic technologies.

Various embodiments may provide an integrated circuit low pass filter including multiple low pass filter circuit structures, each having an input port and an output port, wherein the multiple low pass filter circuit structures are cascaded up to N stages, where N is an integer equal to or larger than one, by coupling an output port of one structure to an input port of another structure through a device selected from the group consisting of transmission lines and inductors, each multiple low pass filter circuit structure including: a first dominant inductor having a first end and a second end; a second dominant inductor having a first end and a second end, wherein the second end of the first dominant inductor is electrically connected to the second end of the second dominant inductor; a first capacitor electrically coupled between the first end of the first dominant inductor and the first end of the second dominant inductor; a first shunt capacitor electrically coupled between the first end of the first dominant inductor and a ground potential; a second shunt capacitor electrically coupled between the first end of the second dominant inductor and the ground potential; an input inductor coupled between the input port and the first end of the first dominant inductor; an output inductor coupled between the output port and the first end of the second dominant inductor; and a second capacitor coupled between a node connecting the second end of the first dominant inductor to the second end of the second dominant inductor and the ground potential, wherein the low pass filter structure has a response of an elliptical filter with one or more zero points generated in a stopband of the low pass filter structure. The multiple low pass filter circuit structures may include lumped elements including parasitic elements, the parasitic elements including frequency dependent lumped element capacitors, resistors and inductors.

It should further be appreciated that the exemplary embodiment or exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the function and arrangement of elements and method of play steps described in an exemplary embodiment without departing from the scope of the invention as set forth in the appended claims.

What is claimed is:

1. A low pass filter comprising:
  a first dominant inductor having a first end and a second end;
  a second dominant inductor having a first end and a second end, wherein the second end of the first dominant inductor is electrically connected to the second end of the second dominant inductor;
  a first capacitor electrically coupled between the first end of the first dominant inductor and the first end of the second dominant inductor;
  a first shunt capacitor electrically coupled between the first end of the first dominant inductor and a ground potential; and
  a second shunt capacitor electrically coupled between the first end of the second dominant inductor and the ground potential,
  wherein the first dominant inductor and the second dominant inductor are further coupled by one or both of magnetic coupling and parasitic mutual capacitive coupling.

2. The low pass filter in accordance with claim 1 further comprising a second capacitor coupled between a node connecting the second end of the first dominant inductor to the second end of the second dominant inductor and the ground potential for the low pass filter to have a response of an elliptical filter with one or more zero points generated in a stopband of the low pass filter.

3. The low pass filter in accordance with claim 1 wherein a value of either or both of the first shunt capacitor and the second shunt capacitor is determined in response to performance of the low pass filter in the stopband.

4. The low pass filter in accordance with claim 1, further comprising:
  an input inductor coupled between an input port and the first end of the first dominant inductor; and
  an output inductor coupled between an output port and the first end of the second dominant inductor,
  wherein either the input inductor and the output inductor or the input port and the output port are electrically coupled by parasitic mutual capacitance.

5. The low pass filter in accordance with claim 4 further comprising a load coupled between the input port and the output port.

6. The low pass filter in accordance with claim 5 wherein the input port and the output port coupled to the load selected from the group consisting of a fifty ohm load and other kinds of loads or circuits.

7. The low pass filter in accordance with claim 1 wherein a value of the first dominant inductor is equal to a value of the second dominant inductor.

8. The low pass filter in accordance with claim 1 wherein a value of the first dominant inductor is not equal to a value of the second dominant inductor.

9. The low pass filter in accordance with claim 1 wherein any of the first dominant inductor, the second dominant inductor, the input inductor, the output inductor, the first capacitor, the second capacitor, the first shunt capacitor or the second shunt capacitor has a form selected from the group consisting of an inductor in series with a resistor, a capacitor in series with a resistor, and any combination of an inductor in series with a resistor and a capacitor in series with a resistor.

10. An integrated circuit low pass filter comprising:
a first dominant inductor having a first end and a second end;
a second dominant inductor having a first end and a second end, wherein the second end of the first dominant inductor is electrically connected to the second end of the second dominant inductor;
a first capacitor electrically coupled between the first end of the first dominant inductor and the first end of the second dominant inductor;
a first shunt capacitor electrically coupled between the first end of the first dominant inductor and a ground potential;
a second shunt capacitor electrically coupled between the first end of the second dominant inductor and the ground potential; and
a second capacitor coupled between a node connecting the second end of the first dominant inductor to the second end of the second dominant inductor and the ground potential,
wherein the first dominant inductor and the second dominant inductor are further coupled by one or both of magnetic coupling and parasitic mutual capacitive coupling, and wherein the integrated circuit low pass filter has a response of an elliptical filter with one or more zero points generated in a stopband of the integrated circuit low pass filter.

11. The integrated circuit low pass filter in accordance with claim 10 wherein the first dominant inductor and the second dominant inductor have substantially similar dimensions.

12. The integrated circuit low pass filter in accordance with claim 10 wherein the first dominant inductor and the second dominant inductor do not have similar dimensions.

13. The integrated circuit low pass filter in accordance with claim 10 wherein the first dominant inductor and the second dominant inductor comprise a structure selected from the groups consisting of high impedance transmission lines, on-chip spiral inductors, and differential inductors.

14. The integrated circuit low pass filter in accordance with claim 13 wherein the structure of either or both of the first dominant inductor and the second dominant inductor comprise on-chip spiral inductors comprising spiral metal layers wherein a shape of the spiral metal layers is selected from the group consisting of rectangular, octagonal, circular, hexagonal and any other shape.

15. The integrated circuit low pass filter in accordance with claim 10 wherein the first dominant inductor and the second dominant inductor are implemented on at least one of one metal layer, or two metal layers or multiple metal layers and either overlap or partially-overlap.

16. The integrated circuit low pass filter in accordance with claim 10 further comprising an input inductor coupled between an input port and the first end of the first dominant inductor, wherein the input inductor and the first dominant inductor are implemented on either the same metal layer, two metal layers or multiple metal layers.

17. The integrated circuit low pass filter in accordance with claim 10 further comprising an output inductor coupled between an output port and the first end of the second dominant inductor, wherein the output inductor and the second dominant inductor are implemented on either the same metal layer, two metal layers or multiple metal layers.

18. The integrated circuit low pass filter in accordance with claim 10 comprising structure implemented in semiconductor technologies selected from the group consisting of CMOS, GaAs, SiGe, InP and ceramic technologies.

19. An integrated circuit low pass filter comprising multiple low pass filter circuit structures, each having an input port and an output port, wherein the multiple low pass filter circuit structures are cascaded up to N stages, where N is an integer equal to or larger than one, by coupling an output port of one structure to an input port of another structure through a device selected from the group consisting of transmission lines and inductors, each multiple low pass filter circuit structure comprising:
a first dominant inductor having a first end and a second end;
a second dominant inductor having a first end and a second end, wherein the second end of the first dominant inductor is electrically connected to the second end of the second dominant inductor;
a first capacitor electrically coupled between the first end of the first dominant inductor and the first end of the second dominant inductor;
a first shunt capacitor electrically coupled between the first end of the first dominant inductor and a ground potential;
a second shunt capacitor electrically coupled between the first end of the second dominant inductor and the ground potential;
an input inductor coupled between the input port and the first end of the first dominant inductor;
an output inductor coupled between the output port and the first end of the second dominant inductor; and
a second capacitor coupled between a node connecting the second end of the first dominant inductor to the second end of the second dominant inductor and the ground potential,
wherein the low pass filter structure has a response of an elliptical filter with one or more zero points generated in a stopband of the low pass filter structure.

20. The integrated circuit low pass filter in accordance with claim 19 wherein the multiple low pass filter circuit structures comprise lumped elements including parasitic elements, the parasitic elements comprising frequency dependent lumped element capacitors, resistors and inductors.

* * * * *